(12) United States Patent
Tidmarsh et al.

(10) Patent No.: US 6,400,500 B1
(45) Date of Patent: Jun. 4, 2002

(54) OPTICAL AMPLIFIER

(75) Inventors: Jolyon R. Tidmarsh, Oxford (GB); Roberto F. Dall'ara, Massagno; Jurg A. Eckner, Klein-Andelfingen, both of (CH)

(73) Assignee: Opto Speed Holdings, S.A. (CH)

( * ) Notice: Subject to any disclaimer, the term of this patent is extended or adjusted under 35 U.S.C. 154(b) by 0 days.

(21) Appl. No.: 09/458,241

(22) Filed: Dec. 9, 1999

(30) Foreign Application Priority Data

Dec. 11, 1998 (GB) .............................................. 9827386

(51) Int. Cl.$^7$ ................................................. H01S 3/00
(52) U.S. Cl. ........................................................ 359/344
(58) Field of Search ............................... 359/344; 372/43

(56) References Cited

U.S. PATENT DOCUMENTS

| | | | |
|---|---|---|---|
| 5,088,105 A | | 2/1992 | Scifres et al. |
| 5,229,879 A | * | 7/1993 | Gen-ei ........................ 359/344 |
| 5,282,080 A | * | 1/1994 | Scrifres et al. ............. 359/344 |
| 5,533,153 A | | 7/1996 | Ota |

FOREIGN PATENT DOCUMENTS

| | | |
|---|---|---|
| EP | 0 549 434 | 6/1993 |
| EP | 0 622 646 | 11/1994 |
| EP | 0 795 778 | 9/1997 |
| WO | WO 93/25923 | 12/1993 |
| WO | WO 96/13084 | 5/1996 |

OTHER PUBLICATIONS

PCT Search Report re application no. PCT. GB99/04147; dated Jun. 15, 2000.
Plaessmann, H. et al, "Subnanosecond Pulse Generation from Diode–Pumped Acousto–Optically Q–Switched Solid–State Lasers," *Applied Op0tics*, vol. 32, No. 33, pp. 6616–6619, Nov. 20, 1993.

* cited by examiner

*Primary Examiner*—Mark Hellner
(74) *Attorney, Agent, or Firm*—Cook, Alex, McFarron, Manzo, Cummings & Mehler, Ltd.

(57) ABSTRACT

A semiconductor optical amplifier comprises a semiconductor member having a plurality of flat edge faces, at least one waveguide with an input and an output on the semiconductor member, at least part of the waveguide being formed of active semiconductor material and the input and the output to the waveguide being located on the same or adjacent edge faces of the member.

22 Claims, 3 Drawing Sheets

OPTICAL AMPLIFIER

BACKGROUND OF THE INVENTION

Semiconductor optical amplifiers are known in which light is transmitted through a semiconductor waveguide by electrical stimulation similar to laser operation. Semiconductor material used in such a waveguide is herein referred to as active material. Typically it will include semiconductor materials from Group III and Group IV. Such active semiconductor materials may be electrically pumped in known manner to cause optical signal amplification. The semiconductor device may be formed as a silicon chip with an integrated waveguide of the type shown in our UK Patent 2307786.

Semiconductor optical amplifiers may be grown on the same crystal substrate as other elements of an optoelectronic integrated circuit. In such a case monolithic integration is achieved. However, other semiconductor optical amplifiers involve hybrid integration where a semiconductor optical amplifying chip is attached to an optoelectronic integrated circuit by mechanical means. This permits the optical amplification chip to be made from material dissimilar to that of the remaining optoelectronic integrated circuit. The integrated circuit device may include waveguides formed from silicon, silicon dioxide, polymer or other materials.

Known semiconductor optical amplifiers may consist of a semiconductor chip of active material arranged so that the optical signal travels across the chip between an input and an output on opposite sides of the chip. Such a prior art arrangement is shown in FIG. 1 where a silicon chip 11 has a linear waveguide 12 passing in a straight line between an input 13 and an output 14 on opposite faces of the chip. The chip has end faces, or facets, 15 and 16. The direction of the waveguide 12 is inclined to the normal direction for each of the end faces 15 and 16 so as to reduce optical reflections at the end faces of the chip to reduce back reflections. Anti-reflective coatings may be formed on the faces 15 and 16 to reduce reflection. The entire optical path between the faces 15 and 16 is electrically pumped to provide optical gain. The geometry of the waveguide 12 may be chosen to ensure that the same gain is achieved for both TE and TM polarisations. When the chip 11 is mechanically mounted in a recess in an optoelectronic integrated circuit as shown in FIG. 1, problems arise in achieving axial location of the waveguide 12 relative to connecting waveguides in the surrounding integrated circuit. In FIG. 1 the chip 11 is mounted in a recess 17 formed in an optoelectronic integrated circuit 18. The circuit 18 has an input waveguide 19 for optical communication with the input 13 of waveguide 12. The circuit 18 has an output waveguide 20 arranged to receive light from the output 14 of the waveguide 12. The waveguides 19 and 20 are each straight and aligned with waveguide 12. To achieve efficient coupling between the waveguide 12 and the waveguides 19 and 20 it is necessary for the ends of the waveguide 12 to be in very close physical proximity to the connecting waveguides 19 and 20. Typically the close physical proximity should result in a gap of less than 1 $\mu$M. It is however difficult to form the chip 11 with accurate dimensions as the facets are formed by mechanical cleaving thereby making it difficult to achieve desired precision in the location of the faces 15 and 16. The faces 15 and 16 may produce smooth vertical facets by fracturing along a crystalline plane thereby producing a high quality face but the precise location of the fracture may be indeterminate. While plasma etching may be used to form accurately located facets, they are of less good optical quality.

FIG. 1 illustrates the effect of the optical amplifier chip being too short for the recess in which it is located. In this case the chip is located in position in the recess 17 by location of the input face 15 against an adjacent face of the recess 17. The chip is also located along an adjacent face 22 of the recess 17. However, the output face 16 of the chip is separated from a wall 23 of the recess thereby causing a gap 24 between the output end of the waveguide 14 and the waveguide 20. If the chip is cleaved too long it will not fit in the recess.

SUMMARY OF THE PRESENT INVENTION

It is an object of the present invention to provide an improved semiconductor optical amplifier which reduces the problems of efficient optical coupling with surrounding optical circuits.

The invention provides a semiconductor optical amplifier comprising a semiconductor device having a plurality of flat edge faces, at least one waveguide with an input and an output on the semiconductor device, at least part of the waveguide being formed of active semiconductor material and said input and output being located on the same or adjacent edge faces of the device.

Preferably the input and output are formed on the same edge face.

Preferably the waveguide extends in a straight line adjacent each of said input and output.

Preferably the waveguide adjacent the input and/or output extends as a straight line inclined at an angle to the normal at the edge space in which the inlet and/or outlet is formed.

In one embodiment the waveguide has two portions, one portion leading from the input and the other portion leading to the output, said two portions being optically linked at a reflector on the device arranged to reflect light from said one portion into said other portion.

Preferably the semiconductor device has an elongated alignment edge formed at an angle to the normal at the edge face in which the input and/or output is formed.

Preferably the alignment edge is formed as a shoulder extending partway through the thickness of the semiconductor device.

The alignment edge may be formed by plasma etching.

Preferably said input and output are each formed in a cleaved facet of the semiconductor device.

The invention includes a semiconductor optical amplifier as aforesaid mounted in a recess on a supporting member having optical communication paths communicating with said input and output.

Preferably the optical communication paths are respective optical waveguides.

Preferably the supporting member is an integrated circuit optoelectronic device.

The recess in the supporting member has a first locating wall engaging an edge face in which said input or said output is formed.

Preferably the recess in said supporting member has a second locating wall engaging an alignment edge of the semiconductor device.

An electrical pumping circuit may be connected to an active portion of the waveguide in the semiconductor device.

DESCRIPTION OF THE PREFERRED EMBODIMENT

Figure 1:
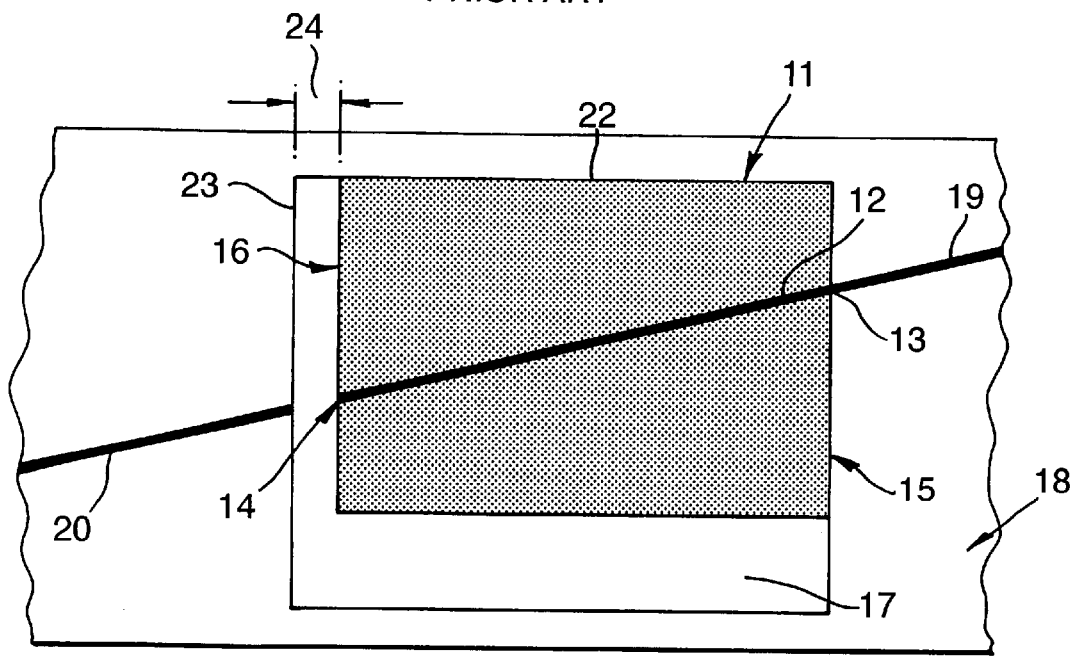
FIG. 1 illustrates a prior art arrangement for an optical amplifier.
Figure 3:
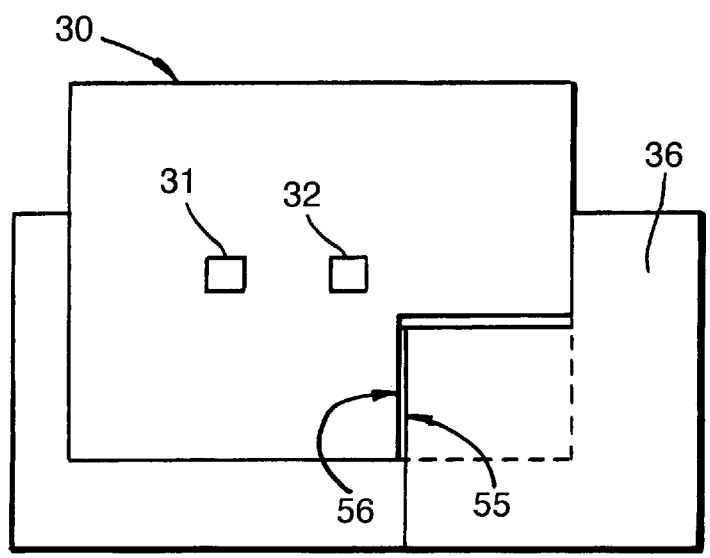
FIG. 3 is a section on line A—A of FIG. 2.
Figure 2:
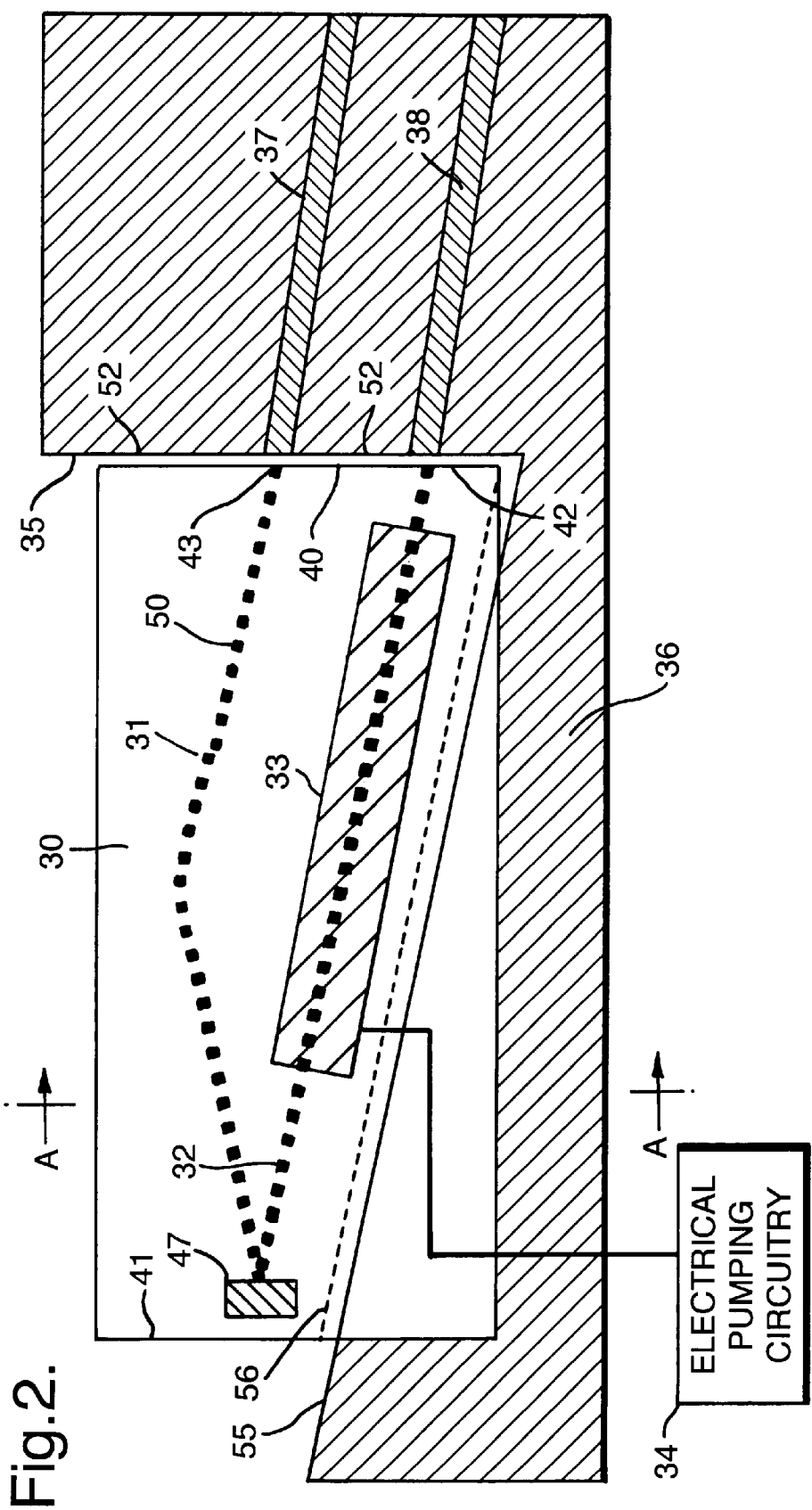
FIG. 2 illustrates a semiconductor optical amplifier in accordance with the present invention.

In the embodiment shown in FIGS. 2 and 3, a semiconductor optical amplifier comprises an integrated semiconductor chip 30 formed for example of gallium arsenide or indium phosphide having formed integrally therein, two waveguides 31 and 32. A region 33 along part of the length of waveguide 32 is formed of active semiconductor material and connected to electrical pumping circuitry 34 so as to amplify the magnitude of optical signals passing through region 33. The chip 30 is mounted in a recess 35 in an optoelectronic integrated circuit 36 formed with two waveguides 37 and 38 arranged to link optically with waveguides 31 and 32 on chip 30.

In the example shown in FIG. 2, the chip 30 is formed as a rectangular chip with four straight sides. The end faces 40 and 41 of the chip are formed by mechanical cleaving although face 41 could be formed by plasma etching. The end face 40 forms a flat facet of high optical quality and provides an input 42 for waveguide 32 and an output 43 for waveguide 31. The input 42 and output 43 are arranged in close proximity to and alignment with the waveguides 37 and 38 on circuit member 36. The chip 30 is provided with a highly reflecting reflector 47 in the optical path of waveguide 32 so that light transmitted through waveguide 32 is incident on reflector 47 and reflected into waveguide 31. In operation, light enters the input 42 of waveguide 32, from waveguide 38, and is amplified by electrical pumping in the active region 33. After amplification the optical signals are reflected by reflector 47 into waveguide 31. Light is then output through the output 43 into waveguide 37. In this example waveguide 31 is curved along its path through the chip 30 although the output end region 50 is straight and parallel to the straight waveguide 32. The straight port on 50 and waveguide 32 are both parallel to the waveguides 37 and 38 and inclined at an angle to the normal to the face 40 so as to minimise reflections at that face. Face 40 is also coated with anti-reflective coating. The device is bi-directional so that the input and output may be reversed.

It will be seen from FIG. 2 that the input and output 42 and 43 for the waveguides 31 and 32 are both located side by side on the same face 40 of the chip 30. To position the chip 30 in the required position in recess 35 with maximum optical coupling, the high quality face 40 of the chip 30 is arranged to abut the mating face 52 of the recess 35. This positions the chip 30 in a required axial position so that both the input 42 and output 43 are positioned in very close physical proximity to the facing waveguides 37 and 38. Both the input and output achieve the same level of physical proximity due to using accurate position of the same face 40 of the chip 30.

To achieve correct positioning in a transverse direction, the circuit member 36 is formed with an etched alignment edge 55 which runs parallel to the length of the waveguide 32. This angled alignment edge extends up to its junction with face 52 forming the axial stop position for the chip. Chip 30 is undercut to form a shoulder 56 which extends partway through the thickness of the chip 30 and is arranged to abut the alignment edge 55 of circuit member 36. The undercut shoulder 56 extends at an angle along the length of the chip 30 so as to extend parallel to and to abut the angled edge 55.

It will be seen that in the above example the chip 30 can be accurately located in position in the recess 35 prior to mechanical fixing in position. By use of the single facet 40 to control the axial position of the chip 30 and the angled alignment edge 55 to control the transverse position, accurate alignment and close physical proximity of the input 42 and output 43 with the connecting waveguides 37 and 38 is achieved regardless of the overall chip size 30. Any variation in the overall chip length between end faces 40 and 41 will not cause any variation in the proximity of the input and output of the chip with the connecting waveguides.

In the above example the waveguides on the chip 30 include both active and passive sections. These can be formed by use of more than one deposition process so that some layers for the active and passive waveguide regions are deposited at different times. The example shown in FIG. 4 comprises a rectangular optical amplifier chip formed of material similar to that already described for the example of FIGS. 2 and 3. In this case the example has two integrally formed waveguides 61 and 62 forming light inputs and outputs respectively. Both waveguides are curved towards an end face 63 so as to be inclined to the normal at the end face 63 and thereby reduce back reflections. Each of the waveguides includes an active region 64 in a region leading to or from a multimode interference coupler in the form of the multimode interferometer 65. The interferometer 65 is connected to an opposite face 66 of the chip by passive waveguides 67 and 68 respectively. Both waveguides 67 and 68 extend to the face 66 and are arranged at right angles to the face 66. Face 66 is a cleaved facet of the chip and has a high reflective coating so as to maximise the reflection of light back from the face 66. In use of this example, light enters waveguide 61 through the end face 63 and after passing through the active region 64 enters the interferometer 65. The light is divided into two paths 70 and 71. Light in path 70 passes through waveguide 67 where it is reflected by the end face 66 and is returned to the interferometer 65 where it crosses over to enter waveguide 62. The other light path 71 is caused to cross over in the interferometer 65 so as to enter waveguide 68 and be reflected by the end face 66 where it is recombined with light reflected from waveguide 67 so that the combined beams pass through the active region 64 of waveguide 62 before passing through the outlet in end face 63.

Figure 4:
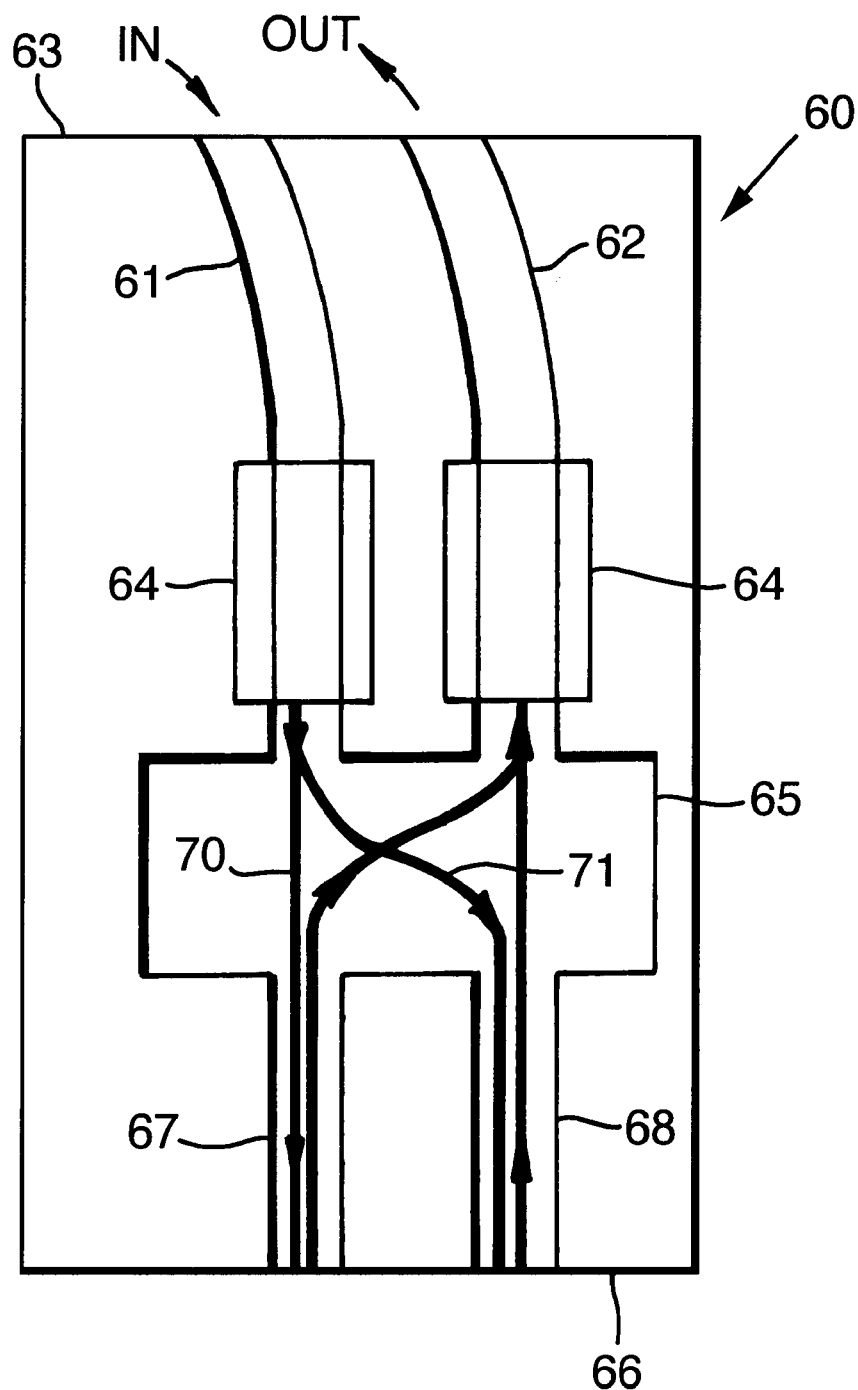
FIG. 4 shows a further embodiment of the invention.

The interferometer 65 is arranged to cause substantially equal distribution of light into the two passive waveguides 67 and 68. By arranging for the reflections to occur on the perpendicular end face 66, light losses are low due to the high reflecting qualities of the coating which is applied to the cleaved facet of the chip. Furthermore, any longitudinal variation in the location of the end face 66 in relation to the input face 63 does not cause any misalignment of the reflective beams as they are reflected normally to the face 66. The two passive waveguides 67 and 68 have the same length in order to couple the reflected signals to the crossover signals joined by the interferometer 65. The absolute length of the waveguides 67 and 68 is not critical provided they have the same length. The active region 64 may be provided on either of the waveguides 61 and 62 or alternatively on both (as shown in FIG. 4). It is however required that the active material 64 is provided on the side of the interferometer 65 towards the input facet 63 and is not located in the passive waveguide 67 and 68 where problems would arise from induced phase difference. An alignment shoulder similar to shoulder 56 of FIG. 2 is formed part way through the thickness of the chip.

The embodiment of FIG. 4 provides a benefit of avoiding the use of an etched mirror inside the chip.

The invention is not limited to the details of the foregoing examples. For instance, in the example shown in FIGS. 2 and 3 the sections of the on chip waveguides 31 and 32 adjacent the input 42 and output 43 are arranged to extend parallel to each other. In other embodiments the two waveguides may be arranged to extend at right angles to each other. The input and output may be located on the same face of the chip or in some cases they may be located on adjacent faces. If located on adjacent faces, then the linking waveguides on the surrounding circuit member will be located on adjacent faces of the recess in which the chip is located. In such a case the proximity of the input and output to the waveguides with which they communicate is determined by the engagement of the chip with two adjacent locating faces of the recess and is not dependent on the overall chip length. In all embodiments the input and output of the on chip waveguide of the amplifier are arranged on the same or adjacent faces of the chip and are not located on opposite faces of the chip.

Although the example illustrated in FIGS. 2 and 3 shows an optical amplifier chip of rectangular form, it is possible for the chip to be formed as a parallelogram with a straight linear waveguide extending between an input and an output on two adjacent faces of the parallelogram. In such a case an etched alignment edge forming a positioning shoulder will extend parallel to the length of the waveguide on the chip thereby providing accurate location in a direction transverse to the length of the waveguide. The angles of the parallelogram and position of the waveguide should be such as to avoid total internal reflection at the junction of the waveguide with the input and output positions.

In examples where a reflector is provided on the amplifying chip to cause a change in signal direction between two waveguides, as shown for example by reflector 47 in FIG. 2, the mirrors may be formed in etched holes in the semiconductor.

In the example of FIG. 2 the region of active material 33 is located along the waveguide 32. It may however be located along waveguide 31 or alternatively, active material may be provided in the paths of both waveguides 31 and 32.

What is claimed is:

1. A semiconductor optical amplifier comprising a semiconductor device having a plurality of flat edge faces, at least one waveguide with an input and an output on the semiconductor device, at least part of the waveguide being formed of active semiconductor material and said input and output being located on the same or adjacent edge faces of the device, and an elongated alignment edge formed at an angle to the normal at the edge face in which the input and/or output is formed.

2. A semiconductor optical amplifier according to claim 1 in which the input and output are formed on the same edge face.

3. A semiconductor optical amplifier according to claim 1 in which the waveguide extends in a straight line adjacent each of said input and output.

4. A semiconductor optical amplifier according to claim 3 in which the waveguide adjacent the input and/or output extends as a straight line inclined at an angle to the normal at the edge space in which the inlet and/or outlet is formed.

5. A semiconductor optical amplifier according to claim 1 in which the waveguide has two portions, one portion leading from the input and the other portion leading to the output, said two portions being optically linked at a reflector on the device arranged to reflect light from said one portion into said other portion.

6. A semiconductor optical amplifier according to claim 5 in which said two portions extend parallel to each other adjacent said input and output.

7. A semiconductor optical amplifier according to claim 1 in which the alignment edge is formed as a shoulder extending partway through the thickness of the semiconductor device.

8. A semiconductor optical amplifier according to claim 1 in which the alignment edge is formed by plasma etching.

9. A semiconductor optical amplifier according to claim 1 in which said input and output are each formed in a cleaved facet of the semiconductor device.

10. A semiconductor optical amplifier as claimed in claim 1 mounted in a recess on a supporting member having optical communication paths communicating with said input and output.

11. A semiconductor optical amplifier as claimed in claim 10 in which the optical communication paths are respective optical waveguides.

12. A semiconductor optical amplifier as claimed in claim 10 in which the supporting member is an integrated circuit optoelectronic device.

13. A semiconductor optical amplifier as claimed in claim 10 in which the recess in the supporting member has a first locating wall engaging an edge face in which said input or said output is formed.

14. A semiconductor optical amplifier as claimed in claim 13 in which the recess in said supporting member has a second locating wall engaging an alignment edge of the semiconductor device.

15. A semiconductor optical amplifier as claimed in claim 10 in which an electrical pumping circuit is connected to an active portion of the waveguide in the semiconductor device.

16. A semiconductor optical amplifier according to claim 2 including a multimode interference coupler located between a reflecting face of the semiconductor device and said input and output.

17. A semiconductor optical amplifier according to claim 16 in which said interference coupler is arranged to split an input signal into two passive waveguides leading to an edge face of the semiconductor device forming a reflector normal to the direction of the waveguide adjacent said reflecting face.

18. A semiconductor device according to claim 17 in which said interference coupler is arranged to recombine a reflected signal from the reflecting face and directly recombine signal through a waveguide to an outlet on the same edge face of the input.

19. A semiconductor optical amplifier according to claim 18 in which waveguides adjacent the inlet and outlet are formed at an angle to the normal at the edge face in which the input and output are formed.

20. A semiconductor optical amplifier comprising a semiconductor device having a plurality of flat edge faces, at least one waveguide with an input and an output on the semiconductor device, the waveguide having two portions, one portion leading from the input and the other portion leading to the output, said two portions being optically linked at a reflector on the device arranged to reflect light from said one portion into said other portion and extending parallel to each other adjacent said input and output.

21. A semiconductor optical amplifier comprising a semiconductor device having a plurality of flat edge faces, at least one waveguide with an input and an output on the semiconductor device, the semiconductor optical amplifier being mounted in a recess on a supporting member having optical communication paths communicating with said input and output, the recess in the supporting member having a first locating wall engaging an edge face in which said input or said output is formed.

22. A semiconductor optical amplifier comprising a semiconductor device having a plurality of flat edge faces, at least one waveguide with an input and an output on the semiconductor device, at least part of the waveguide being formed of active semiconductor material, said input and output being formed on the same edge face of the device, and a multimode interference coupler located between a reflecting face of the semiconductor device and said input and output, with an optically active material being included in a signal path between the interference coupler and the edge face in which the input and output are formed.

* * * * *

UNITED STATES PATENT AND TRADEMARK OFFICE
CERTIFICATE OF CORRECTION

PATENT NO. : 6,400,500 B1
DATED : June 4, 2002
INVENTOR(S) : Jolyon R. Tidmarsh, Roberto F. Dall'ara and Jurg A. Eckner It is certified that error appears in the above-identified patent and that said Letters Patent is hereby corrected as shown below:

<u>Title page,</u>
Item [73], Assignee, delete "Holdings" and add -- Holding --;
Add -- Bookham Technology PLC (GB) --.

Signed and Sealed this

Fifth Day of November, 2002

*Attest:*

*Attesting Officer*

JAMES E. ROGAN
*Director of the United States Patent and Trademark Office*